(12) United States Patent
Delmotte et al.

(10) Patent No.: US 8,354,966 B2
(45) Date of Patent: Jan. 15, 2013

(54) PERIPHERAL TELECOMMUNICATIONS DEVICE HAVING MOVABLE COVER WITH INTEGRATED ANTENNA

(75) Inventors: Peter Delmotte, Leuven (BE);
Sheng-Gen Pan, Kamp-Lintfort (DE);
Roger Laurisch, Düsseldorf (DE);
Georg Steiner, Neukirchen-Vluyn (DE);
Walter Nijs, Holsbeek (BE)

(73) Assignee: Option, Leuven (BE)

( * ) Notice: Subject to any disclaimer, the term of this patent is extended or adjusted under 35 U.S.C. 154(b) by 932 days.

(21) Appl. No.: 12/332,912

(22) Filed: Dec. 11, 2008

(65) Prior Publication Data

US 2009/0158062 A1    Jun. 18, 2009

(51) Int. Cl.
*H01Q 1/24* (2006.01)
*H01Q 1/42* (2006.01)
(52) U.S. Cl. ................................. 343/702; 343/872
(58) Field of Classification Search .............. 343/702, 343/700 MS, 872, 873
See application file for complete search history.

(56) References Cited

U.S. PATENT DOCUMENTS

| | | | |
|---|---|---|---|
| 6,758,689 B1 | 7/2004 | Bair | |
| 6,822,611 B1* | 11/2004 | Kontogeorgakis et al. | 343/702 |
| 6,926,544 B2* | 8/2005 | Lee | 439/147 |
| 7,091,910 B2* | 8/2006 | Liang et al. | 343/702 |
| 7,132,987 B1* | 11/2006 | Olsson et al. | 343/702 |
| 7,438,562 B2* | 10/2008 | Ni et al. | 439/79 |
| 7,586,460 B2* | 9/2009 | Hunt et al. | 343/882 |
| 2005/0001775 A1 | 1/2005 | Liang | |
| 2006/0208066 A1 | 9/2006 | Finn et al. | |
| 2008/0018552 A1* | 1/2008 | Nakajima et al. | 343/882 |
| 2009/0058731 A1* | 3/2009 | Geary et al. | 343/700 MS |

FOREIGN PATENT DOCUMENTS

EP       1367497 A2    12/2003

* cited by examiner

*Primary Examiner* — Jacob Y Choi
*Assistant Examiner* — Hasan Islam
(74) *Attorney, Agent, or Firm* — Browdy and Neimark, PLLC (57) ABSTRACT

A computer peripheral telecommunications device having an electronic interface for connection to a computer and being configured for adding wireless telecommunication functionality to the computer, the device comprising a movable cover portion for covering the electronic interface while not in use and an antenna integrated in the movable cover portion.

22 Claims, 7 Drawing Sheets

PERIPHERAL TELECOMMUNICATIONS DEVICE HAVING MOVABLE COVER WITH INTEGRATED ANTENNA

TECHNICAL FIELD

The present invention relates to a computer peripheral telecommunications device, in particular a telecommunications device having an electronic interface for connection to a computer and configured for adding wireless telecommunication functionality to the computer.

BACKGROUND ART

Many known computer peripherals, in particular those of the "USB-stick" type, have an electronic interface for physical connection to a complementary interface on a computer. A movable or removable cover portion protects this interface while not in use.

Other computer peripherals are known which are configured for adding wireless telecommunication functionality to the computer to which they are connected. These devices often have extensible antennas for improving transmission/reception while in use.

From US-A-2005/0001775 a computer peripheral telecommunications device is known which has a movable cover portion for protecting its electronic interface, by means of which it is connectable to a computer for adding wireless communication functionality. The antenna which is used for enabling wireless communication between the computer and a wireless network is integrated in the movable cover and is electrically connected to the components in the body of the device via a pivoting connection. The movable cover is pivotally connected to the sides of the device and is moved to an upright position in use.

The device known from US-A-2005/0001775 has the disadvantage that there is a high risk of breaking off the movable cover in its use position, especially when the device is used on a portable computer.

DISCLOSURE OF THE INVENTION

It is an aim of the present invention to provide a computer peripheral telecommunications device having a movable cover portion for protecting its electronic interface and an antenna integrated in the movable cover portion, with a reduced risk of breakage.

This aim is achieved according to the invention with the computer peripheral telecommunications device showing the technical features of claim 1.

The computer peripheral telecommunications device according to the invention comprises:
- a housing containing a plurality of electronic components providing said wireless telecommunication functionality, said housing defining a plane,
- an electronic interface for connecting the device to a computer, provided on a first side of the housing and extending parallel to the plane of the housing,
- a movable cover portion with integrated antenna, movably connected to the housing and movable between a protective position in which it covers the electronic interface and at least one predefined use position in which the integrated antenna is extended from the housing,
- an electronic connection between the antenna and the electronic components in the housing.

According to the invention, the movable cover portion forms an extension of the housing while it is in the/each predefined use position, in particular in the plane defined by the housing. This means that in the use position(s), the movable cover portion extends along the same plane as the housing and the interface on the housing.

When the device of the invention is used on a common portable computer, the movable cover portion extends in the plane defined by the main board part of the portable computer, i.e. the part on which the keyboard is provided and which is usually placed horizontally on a support surface while a user is working on the computer. As a result of the fact that the cover portion extends along the same plane as the housing and the interface, the cover portion is in use closely above the support surface on which the portable computer is placed. As opposed to the upright position which is used in the prior art, there is much less risk that the user can accidentally strike the cover portion with his hands while working on the portable computer. Hence, the risk of damaging the device can be reduced.

In preferred embodiments, the movable cover portion is hingeably mounted on the housing. Preferably, the hinge axis is located at a distance from the first side of ½ to ¾, preferably about ⅔ of the length of the housing with the length being measured perpendicularly to the first side. Such a distance has the advantage that a maximum spacing of the integrated antenna from the components in the housing can be achieved (which may include a further antenna e.g. Rx and/or Tx diversity—see below), while taking into account compactness of the device. In alternative embodiments, the cover portion can be slidably mounted on the housing, such that it can be slid over the interface while not in use.

In preferred embodiments, the cover portion is a U-shaped swivel member of which both ends are hingeably fixed to hinge members on top and bottom sides of the housing (the top and bottom sides being the sides parallel to the plane of the housing). This construction has the advantage that a very robust device can be achieved.

Preferably, the hinge members have a diameter of at least half the width of the housing to further enhance robustness.

In order to minimize friction and noise between the hingeable cover portion and the housing, the hinge members are preferably made in a self-lubricating plastic material.

In preferred embodiments, multiple use positions are defined, so the user can select the most appropriate one. For example, in the case of the hingeable cover portion described above, the antenna is preferably designed such that its efficiency is substantially equal in a range of use positions between about +90° and about −90° with respect to the housing (about 0° being the protective position). The use positions can conveniently be defined by resilient positioning members, which can be integral parts of the hinge members.

In preferred embodiments, the integrated antenna is preferably a radiation pattern provided on a thin foil or a sheet metal radiation pattern, which is located on or in the movable cover portion and is electronically connected to the components in the housing at the hinge. The antenna may be monopole (1 connection) or dipole (2 connections) e.g. a planar inverted-F antenna (PIFA).

The electronic connection between the integrated antenna and the components in the housing may be a contacting connection, preferably using a resilient contact, such as for example by means of a pogo pin in the centre of the hinge, or a contactless connection, e.g. a capacitive coupling at the hinge.

In preferred embodiments, the computer peripheral telecommunications device of the invention further comprises at least one slot for receiving an electronic card, such as for example a subscriber identity module (SIM) card, a secure digital (SD) card, a micro SD card, or any other smart card, data card or memory card known to the person skilled in the art.

In preferred embodiments, the computer peripheral telecommunications device of the invention further comprises a connector for connecting additional equipment, such as for example an external antenna or a headset.

In preferred embodiments, the computer peripheral telecommunications device of the invention further comprises a diversity antenna adjacent to the first side where the interface is provided, i.e. at a location within the housing as far as possible from the antenna integrated in the movable cover portion to avoid interference.

In preferred embodiments, the computer peripheral telecommunications device of the invention is a USB device, the interface being a USB plug. The USB plug is preferably eccentrically mounted on the housing, such that it can be avoided that the device in use covers two adjacent USB sockets on the computer at the same time. The computer peripheral telecommunications device of the invention may however also have any other type of interface known to the person skilled in the art, such as for example a firewire interface, a PCMCIA interface, a PCI express interface or other.

BRIEF DESCRIPTION OF THE DRAWINGS

The invention will be further elucidated by means of the following description and the appended figures.

MODES FOR CARRYING OUT THE INVENTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

First Embodiment

FIGS. 1-6

In the computer peripheral telecommunications device 1 shown in FIGS. 1-6, the antenna 2 which is used for enabling wireless communication between the computer and a wireless network is integrated in a movable cover portion 3. This movable cover portion 3 is movably mounted on a generally parallelepiped-shaped housing 4 of the device, which houses the electronic components 5 for establishing the wireless connectivity and shows a fixed electronic interface 6 on one side, which is connectable to a complementary interface on a computer. On this side, the housing also has a SIM slot 20 for inserting and connecting a SIM card 10.

Figure 1:
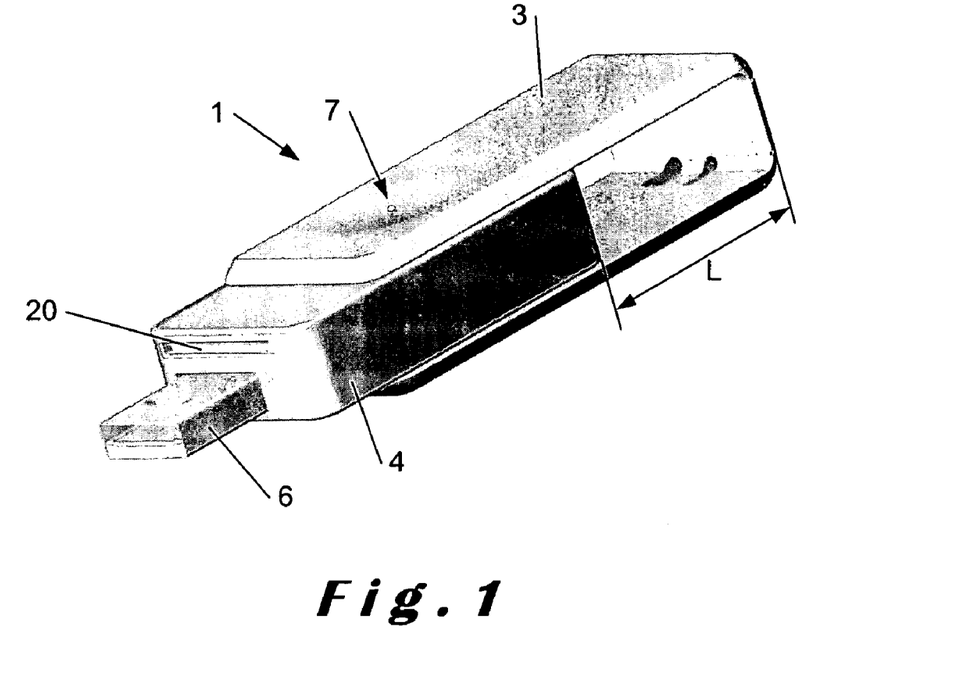
FIGS. 1-6 show a first embodiment of a computer peripheral telecommunications device according to the invention.
Figure 2:
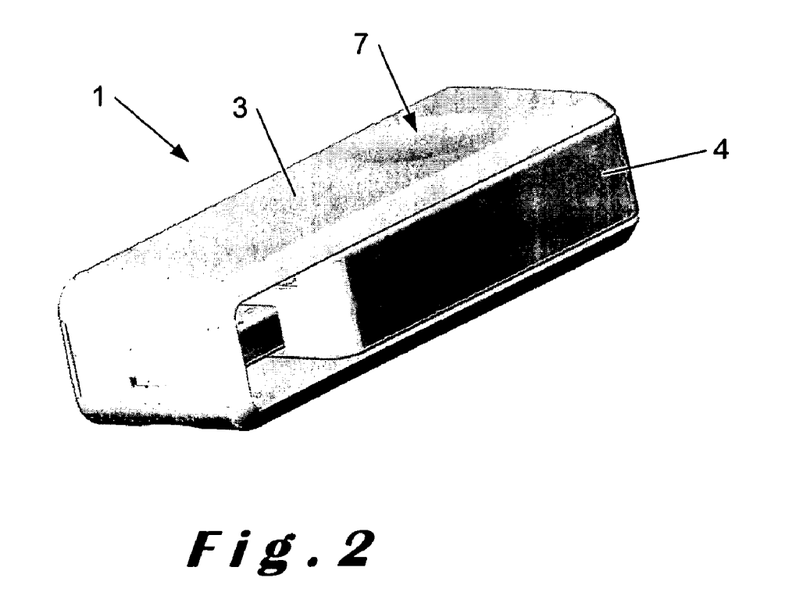

The movable cover portion 3 with integrated antenna 2 is rotatable over 360° around the housing. It is movable between a protective position (shown in FIG. 2) in which the interface 6 and the SIM card slot 20 are protected and a range of predefined use positions (one of which is shown in FIG. 1), in particular the semi-circle of 90°-270° with 0° being the protective position. In this range of use positions the cover portion forms an extension of the housing, which at minimum has a predetermined length L, such that the integrated antenna 2 which extends throughout this extension is at least partly spaced from the electronic components inside the housing and the wireless connectivity can be improved. In all use positions, the cover portion 3 remains generally in the plane defined by the housing, so that it does not stand upright when the device is used for example on a laptop computer, which commonly has its interfaces for peripherals on its motherboard part, parallel to its bottom side and hence parallel to the support surface on which it is placed. As a result, the movable cover portion 3 can remain parallel and closely above this support surface and only a low damage risk exists.

The cover portion is a U-shaped member 3 of which both legs 8, 9 are hingeably fixed to top and bottom sides of the housing 4. The length of the U-shaped member 3 and the location of the hinge axis 7 on the housing are predeterminedly selected such, that in each use position the U-shaped member extends at least the predetermined length L from the side of the housing, so that the integrated antenna is spaced from the electronic components inside the housing and wireless connectivity can be improved, while compactness of the device is also taken into account. This is achieved by placing the hinge axis 7 between ½ and ¾, preferably about ⅔ of the length of the housing, measured from the side on which the interface 6 is located. At this distance, the device is compact in both the protective position (shown in FIG. 2) and any of the defined use positions (the 180° position being shown in FIG. 1), while the extension of the swivel member 3 is sufficient to space the integrated antenna 2 from the components 5 in the housing and minimize interference.

Figure 3:
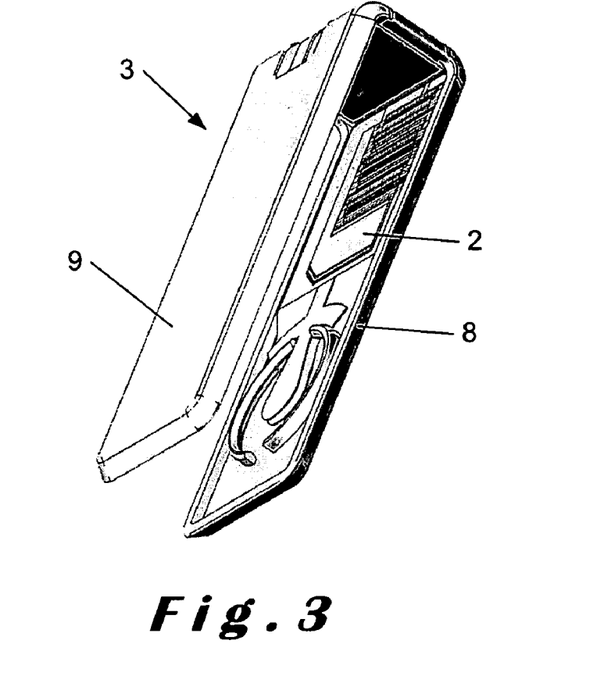

At this distance, the improvement is two-fold: on the one hand the length of the antenna 2 can be increased. FIG. 3 shows a view of the U-shaped member 3 alone with the antenna 2 in the top leg 8, extending as far as possible in the leg 8. The improvement in wireless connectivity follows from the Wheeler formula:

$$(\Delta f/f)\eta < 13 V/\lambda^3 \qquad \text{(eq 1)}$$

In which η is the antenna efficiency, (Δf/f) is the fractional bandwidth, V is the volume of a sphere as small as possible still enclosing the radiating structure ("antenna") and all other conductive parts involved and λ is the wavelength. It is clear that an increase in length leads to an increase in the volume V and hence an increase in the efficiency η.

On the other hand the radiation pattern 2a of the antenna, which is integrated in the U-shaped member in the part forming the extension of length L, is moved away from the other components 5 in the housing (see FIG. 6), so interference is minimized. These other components 5 include a top PCB 11 with a connector for a SIM 10, two burst capacitors 12, 13 and a contact for the pogo pin 15, which makes the electrical contact between the antenna 2 and the top PCB 11. The components 5 further include a bottom PCB 14 with various components for converting data to transmission signals and vice versa and for controlling communication towards the computer over the interface 6 and others.

Figure 6:
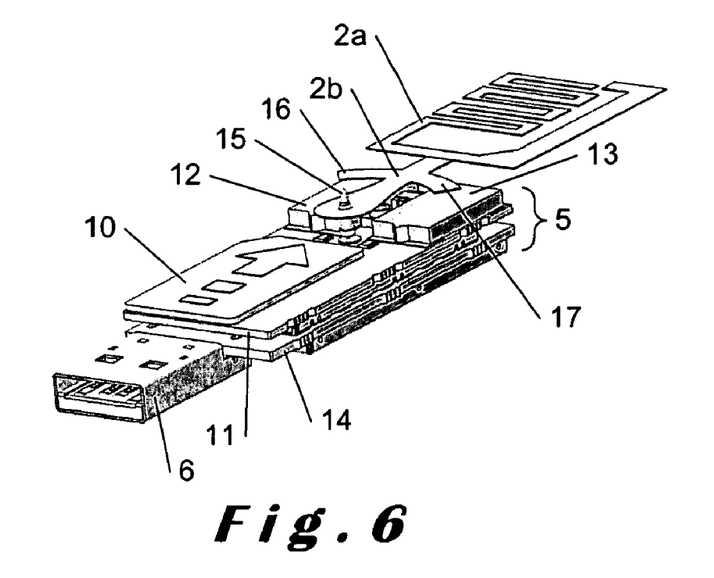

The integrated antenna 2 comprises a radiation pattern 2a provided on a thin foil (not shown), which is fixed to the inside of the top leg 8 of the movable cover portion 3 and is electronically connected to the components 5 in the housing at the hinge 7 by means of an oblong part 2b and a resilient contact, in particular the pogo pin 15 in the centre of the top hinge part 18.

The antenna 2 is a monopole antenna with a single connection 15 towards the internal components 5. In alternative embodiments a dipole antenna can also be used, e.g. a planar inverted-F antenna (PIFA). Such would involve a ground plane in the lower leg 9 of the U-shaped member 3 connected to the internal components 5 by means of a pogo pin through the bottom hinge part 19.

The antenna, as shown in FIG. 6, comprises a radiation pattern 2a to form a multiband antenna with different legs for different frequency bands. Such antenna shapes are generally known in the art and therefore need no further description here. For the same reason, only one example of the radiation pattern is shown, where it is evident that this can be varied according to the desired specifications. The radiation pattern part 2a of the antenna is located in the part of the movable cover portion 3 forming the extension in the range of use positions, so that it is spaced from the components 5 in the interior of the housing.

The antenna 2 is furthermore designed such that its efficiency is substantially equal in the range of use positions between about +90° and about −90° (or 270°) with respect to the housing (0° being the protective position). This is achieved by the sideways extending stubs 16, 17.

Instead of the pogo pin 15, the/each connection between the integrated antenna and the components in the housing may be a contactless connection, e.g. a capacitive coupling at the hinge.

Figure 4:
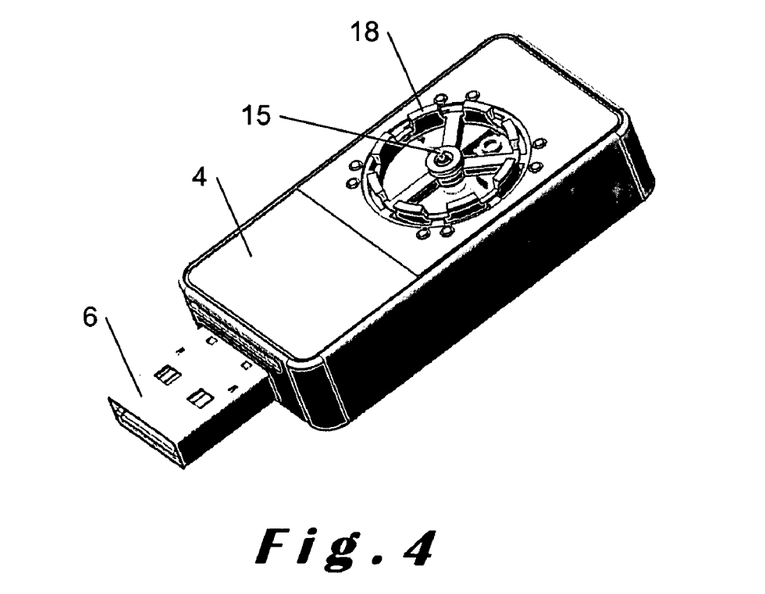
Figure 5:
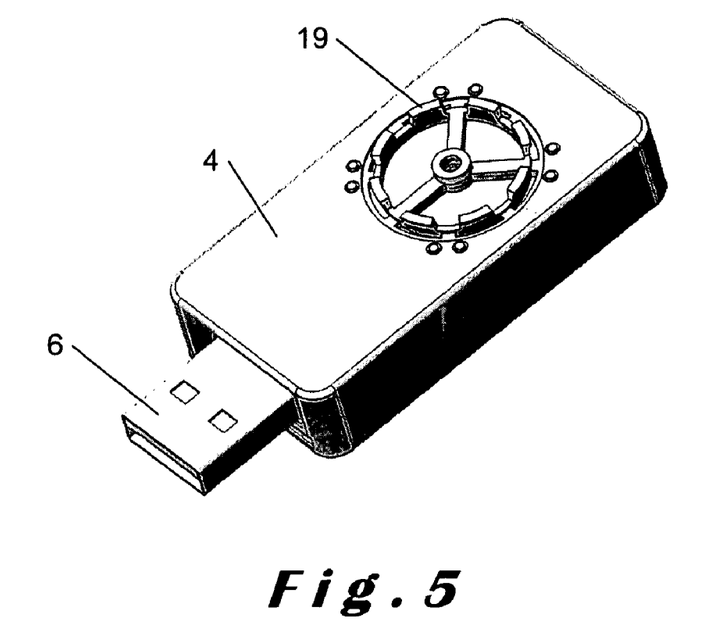

In order to minimize friction and noise between the hingeable cover portion and the housing, the hinge parts 18, 19, around which the U-shaped member 3 rotates and which are respectively shown in FIGS. 4 and 5, are made in a self-lubricating plastic material. In FIG. 4 it is shown that the pogo pin 15 is located in the centre of the top hinge part 18.

The computer peripheral telecommunications device 1 is a USB dongle, the interface 6 being a USB plug. The USB plug is eccentrically mounted on the housing 4, such that it can be avoided that the device in use covers two adjacent USB sockets on the computer at the same time.

From a constructional point of view, the U-shaped member 3 is constructed as two separate parts, each one containing one of the legs 8, 9 and one of two complementary snap-fitting connecting members at the base of the U. So the U-shaped member 3 is mounted around the housing by simply snap-fitting the two parts together. The hinge members 18, 19 have resilient teeth engaging the complementary semi-circular structures shown in FIG. 3 on the inside of the cover portion 3 in a snap-fitting manner. So assembling the U-shaped cover portion 3 around the housing 4 is performed by simply snap-fitting the parts together.

The hinge members 18-19 are circular members having a large diameter, preferably at least half the width of the top and bottom sides of the housing, so that a large contact surface with the cover portion 3 is achieved and robustness can be enhanced. The hinge member 18 exposes LEDs (not shown) in the interior of the housing, whose emitted light is shown to users as a result of a partial transparency of the material of the cover portion 3.

Second Embodiment

FIGS. 7-13

In the computer peripheral telecommunications device 21 shown in FIGS. 7-13, the antenna 22 which is used for enabling wireless communication between the computer and a wireless network is integrated in a movable cover portion 23. This movable cover portion 23 is movably mounted on a generally parallelepiped-shaped housing 24 of the device, which houses the electronic components 25 for establishing the wireless connectivity and shows a fixed electronic interface 26 on one side, which is connectable to a complementary interface on a computer. On this side, the housing also has a SIM slot 40 for inserting and connecting a SIM card 30.

Figure 7:
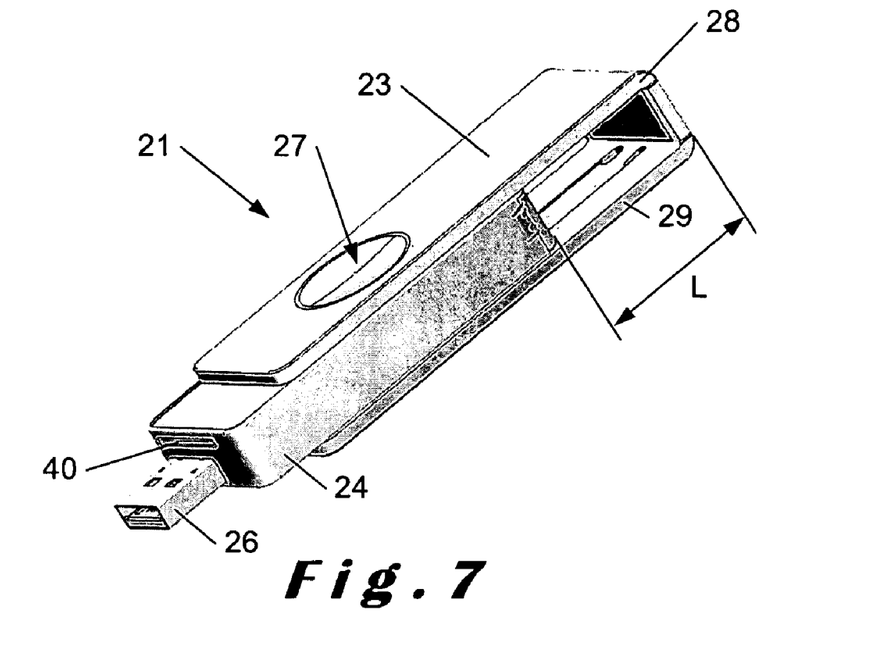
FIGS. 7-13 show a second embodiment of a computer peripheral telecommunications device according to the invention.
Figure 8:
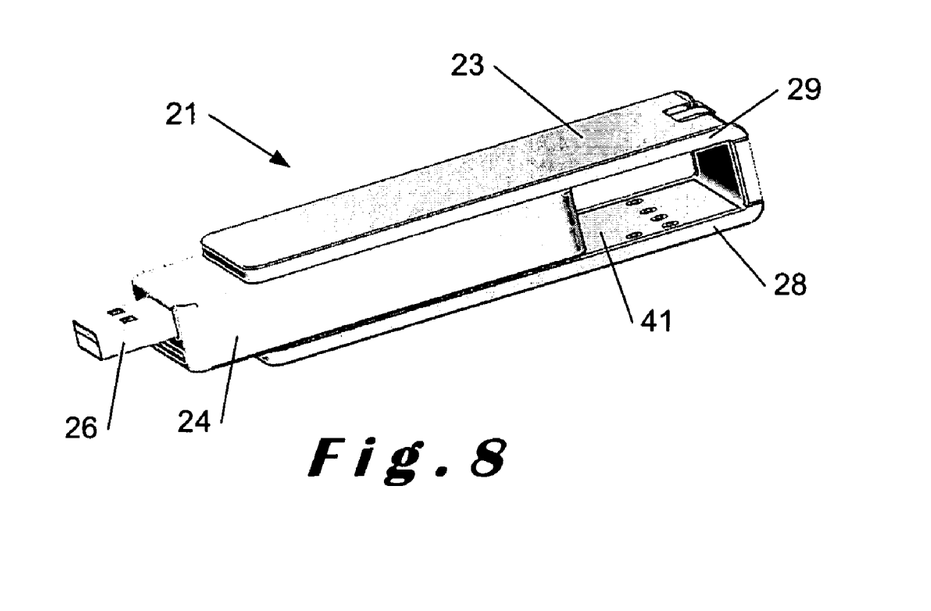

The movable cover portion 23 with integrated antenna 22 is rotatable over 360° around the housing. It is movable between a protective position (not shown but similar to FIG. 2) in which the interface 26 and the SIM card slot 40 are protected and a number of predefined use positions (one of which is shown in FIGS. 7-8), in particular the positions 90°, 180° and 270° with 0° being the protective position. In the use positions the cover portion forms an extension of the housing, which at minimum has a predetermined length L, such that the integrated antenna 22 which extends throughout this extension is at least partly spaced from the electronic components inside the housing and the wireless connectivity can be improved. In all use positions, the cover portion 23 remains generally in the plane defined by the housing, so that it does not stand upright when the device is used for example on a laptop computer, which commonly has its interfaces for peripherals on its motherboard part, parallel to its bottom side and hence parallel to the support surface on which it is placed. As a result, the movable cover portion 23 can remain parallel and closely above this support surface and only a low damage risk exists.

The cover portion is a U-shaped member 23 of which both legs 28, 29 are hingeably fixed to top and bottom sides of the housing 24. The length of the U-shaped member 23 and the location of the hinge axis 27 on the housing are predeterminedly selected such, that in each use position the U-shaped member extends at least the predetermined length L from the side of the housing, so that the integrated antenna is spaced from the electronic components inside the housing and wireless connectivity can be improved, while compactness of the device is also taken into account. This is achieved by placing the hinge axis 27 between ½ and ¾, preferably about ⅔ of the length of the housing, measured from the side on which the interface 26 is located. At this distance, the device is compact in both the protective position and any of the defined use positions (the 180° position being shown in FIGS. 7-8), while the extension of the swivel member 23 is sufficient to space the integrated antenna 22 from the components 25 in the housing and minimize interference.

Figure 9:
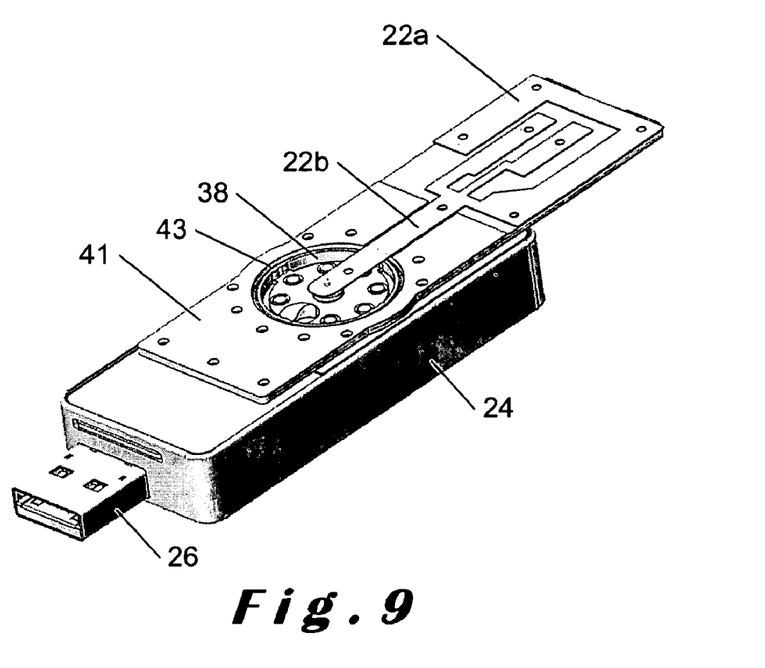

At this distance, the improvement is two-fold: on the one hand the length of the antenna 22 can be increased. FIG. 9 shows a view of the device in which part of the U-shaped member 23 is taken away, leaving the antenna 22 on an antenna support 41. This antenna support 41 and the top leg 28 of the U-shaped member 23 enclose the antenna 22 between them. As shown in FIG. 9 the antenna 22 extends as far as possible in the leg 28. The improvement in wireless connectivity follows from the Wheeler formula eq 1 as has been described for the first embodiment.

On the other hand the radiation pattern 22$a$ of the antenna, which is integrated in the U-shaped member in the part forming the extension of length L, is moved away from the other components 25 in the housing (see FIG. 11), so interference is minimized. These other components 25 include a top PCB 31 with a holder 42 for a SIM 30, two burst capacitors 32, 33 and a contact for the pogo pin 35, which makes the electrical contact between the antenna 22 and the top PCB 31. The components 25 further include a bottom PCB 34 with various components for converting data to transmission signals and vice versa and for controlling communication towards the computer over the interface 26 and others. One of the other components is here a diversity antenna 46, placed at a location within the housing as far as possible from the antenna 22 integrated in the movable cover portion to avoid interference.

The integrated antenna 22 is a sheet metal antenna, which is located in the top leg 28 of the movable cover portion 23. The sheet metal antenna comprises the radiation pattern 22$a$ and an oblong part 22$b$ which electronically connects to the components 25 in the housing at the hinge 27 by means of a resilient contact, in particular the pogo pin 35 in the centre of the top hinge part 38.

The antenna 22 is a monopole antenna with a single connection 35 towards the internal components 25. In alternative embodiments a dipole antenna can also be used, e.g. a planar inverted-F antenna (PIFA). Such would involve a ground plane in the lower leg 29 of the U-shaped member 23 connected to the internal components 25 by means of a pogo pin through the bottom hinge part.

The antenna, as shown in FIG. 9, comprises a radiation pattern 22$a$ to form a multiband antenna with different legs for different frequency bands. Such antenna shapes are generally known in the art and therefore need no further description here. For the same reason, only one example of the radiation pattern is shown, where it is evident that this can be varied according to the desired specifications. The radiation pattern part 22$a$ of the antenna is located in the part of the movable cover portion 23 forming the extension in the different use positions, so that it is spaced from the components 25 in the interior of the housing.

Instead of the pogo pin 35, the/each connection between the integrated antenna and the components in the housing may be a contactless connection, e.g. a capacitive coupling at the hinge.

Figure 10:
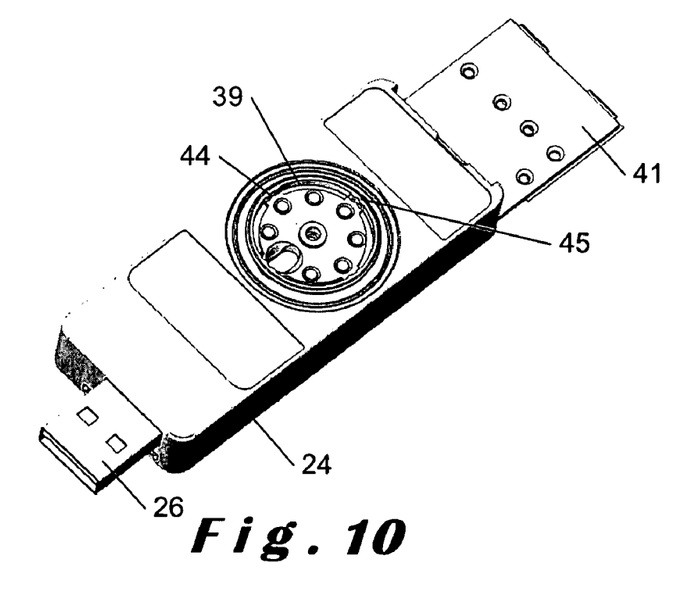
Figure 11:
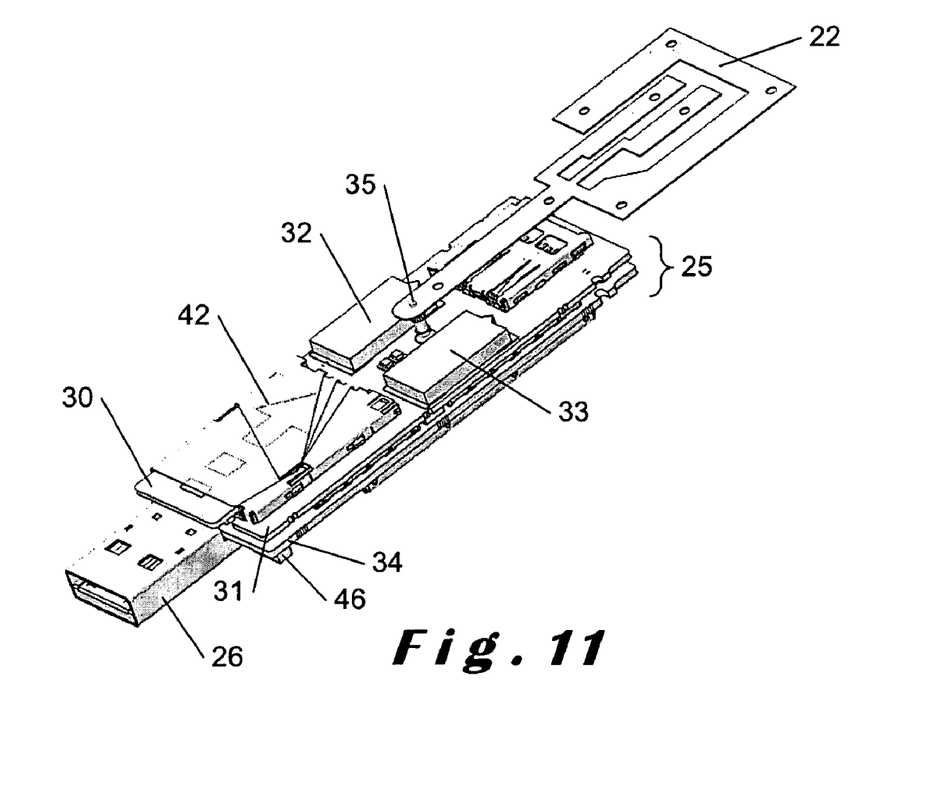

In order to minimize friction and noise between the hingeable cover portion and the housing, the hinge parts 38, 39, around which the U-shaped member 23 rotates and which are respectively shown in FIGS. 9 and 10, are made in a self-lubricating plastic material. In FIG. 9 it is shown that the pogo pin 35 is located in the centre of the top hinge part 38. These figures further show that the device 21 is provided with positioning means 43-45 for defining the protective and use positions of the cover portion, namely about 0°, about 90°, about 180°, about −90° (or 270°). The positioning means are formed by resilient positioning members 43-45 which are integral parts of the hinge parts 38, 39.

Figure 12:
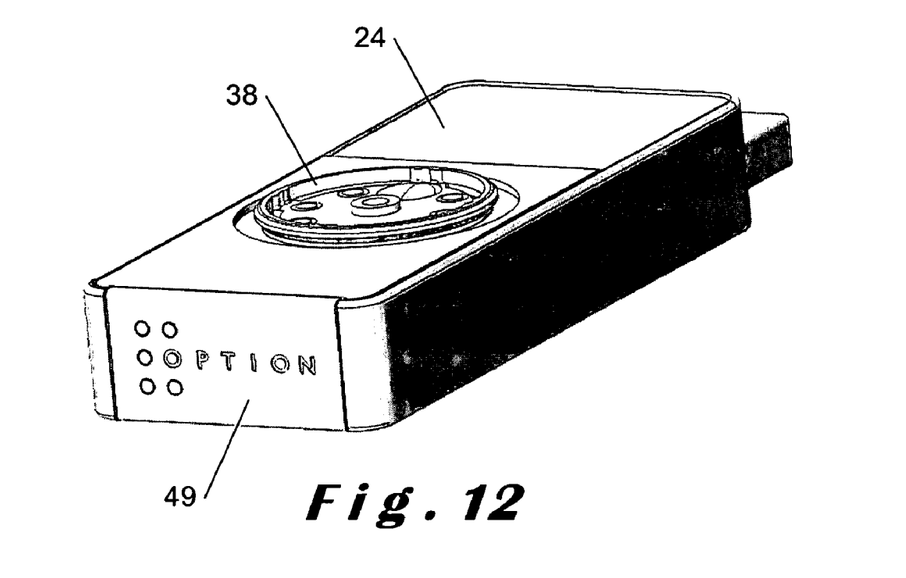
Figure 13:
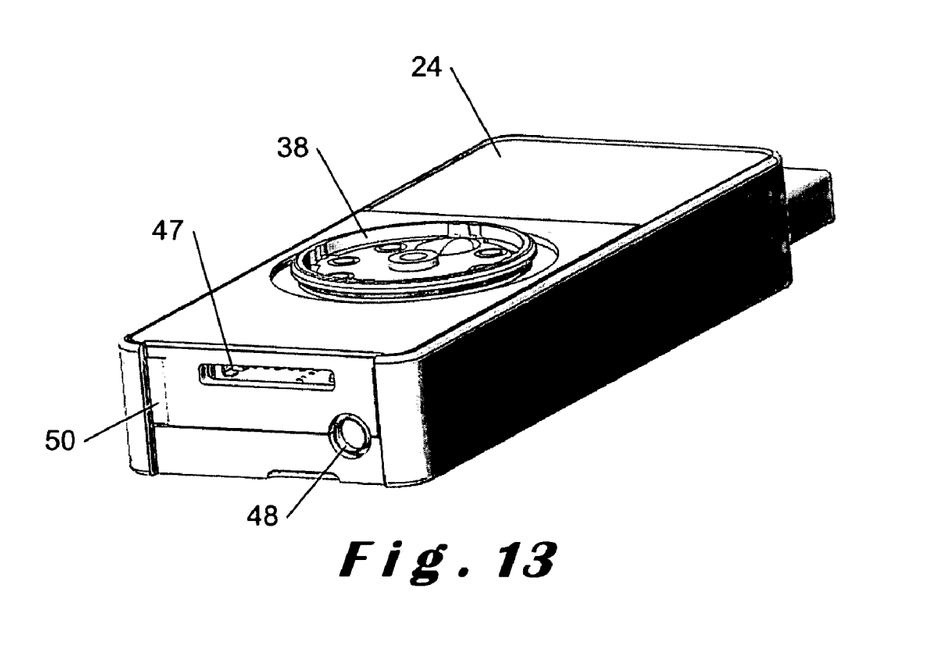

Referring to FIGS. 12-13, the computer peripheral telecommunications device 21 further comprises an SD slot 47 for inserting and connecting an SD card, preferably a micro SD card, a connector 48 for connecting additional equipment, such as for example an external antenna or a headset. This slot 47 and connector 48 are coverable by means of a removable covering lip 49, a portion of which can be inserted in and removed from a corresponding slot 50.

The computer peripheral telecommunications device 21 is a USB dongle, the interface 26 being a USB plug. The USB plug is eccentrically mounted on the housing 24, such that it can be avoided that the device in use covers two adjacent USB sockets on the computer at the same time.

From a constructional point of view, the U-shaped member 23 is constructed as two separate parts, each one containing one of the legs 28, 29 and one of two complementary snap-fitting connecting members at the base of the U. So the U-shaped member 23 is mounted around the housing by simply snap-fitting the two parts together.

The hinge members 38-39 are circular members having a large diameter, preferably at least half the width of the top and bottom sides of the housing, so that a large contact surface with the cover portion 23 is achieved and robustness can be enhanced. The hinge member 38 exposes LEDs (not shown) in the interior of the housing, whose emitted light is shown to users as a result of a partial transparency of the material of the cover portion 3.

Alternative Embodiments

Not Shown

In alternative embodiments, the legs of the radiations patterns 2$a$, 22$a$ could be electrically separated from each other, with a separate switch or sliding connection for connecting only one or a sub-group of the legs to the internal components of the device. The legs could also be differently loaded by predefined impedance. In this way, only a portion of the transmission bandwidth is selected, which may highly increase the efficiency of the antenna. See Wheeler eq 1 above: limiting Δf for the same volume V and wavelength λ leads to an increase in the efficiency η.

In alternative embodiments, the movable cover portion 3, 23 could also be a part which is slidably fixed to the housing 4, 24, for example with teeth engaging in grooves on the opposite longitudinal sides of the housing enabling the cover portion to slide along the housing between a protective position in which the cover portion covers the interface 6, 26 and a use position in which the cover portion extends on the opposite side of where the interface 6, 26 is located to form an extension with a predetermined length L. In such embodiments, the antenna preferably also comprises a multiband radiation pattern located in the part of the cover portion forming the extension, so that the radiation pattern is in use maximally spaced from the components in the housing.

The invention claimed is:

1. A computer peripheral telecommunications device configured for adding wireless telecommunication functionality to a computer, the device comprising
    a housing containing a plurality of electronic components providing said wireless telecommunication functionality, said housing defining a plane,
    an electronic interface for connecting the device to a computer, provided on a first side of the housing and extending parallel to the plane of the housing, a movable cover portion with integrated antenna, movably connected to the housing and movable between a protective position in which it covers the electronic interface and at least one predefined use position in which the integrated antenna is extended from the housing, the integrated antenna being provided to an inner surface of the cover portion, an electronic connection between the antenna and the electronic components in the housing, wherein, in each predefined use position, the movable cover portion forms an extension of the housing in the plane of the housing, wherein the housing has a length, measured perpendicularly to the first side, the movable cover portion being hingeably mounted on the housing with a hinge axis at a distance from the first side, the distance being between ½ and ¾ of the length of the housing, wherein the antenna comprises a radiation pattern having different legs for radiating in different frequency bands and a connection part connecting the radiation pattern to the electronic connection, the radiation pattern being located in a part of the movable cover portion forming the extension in each predefined use position and extending throughout said part.

2. The computer peripheral telecommunications device according to claim 1, wherein the distance is about ⅔ of the length of the housing.

3. The computer peripheral telecommunications device according to claim 1, wherein the cover portion is a U-shaped swivel member of which ends are hingeably fixed to hinge members on top and bottom sides of the housing, the top and bottom sides being parallel to said plane.

4. The computer peripheral telecommunications device according to claim 3, wherein the hinge members have a diameter of at least half the width of the housing.

5. The computer peripheral telecommunications device according to claim 3, wherein the hinge members are made in a self-lubricating plastic material.

6. The computer peripheral telecommunications device according to claim 3, wherein the hinge members comprise integral resilient positioning members for defining at least one of the protective and use positions.

7. The computer peripheral telecommunications device according to claim 3, wherein at least one of the hinge members comprises an opening exposing a LED mounted within the housing and at least the part of the movable cover portion covering said opening is constructed in an at least partially transparent material for passing light emitted by said LED to a user.

8. The computer peripheral telecommunications device according to claim 3, wherein the hinge members comprise integral resilient teeth for engaging complementary parts on the ends of the U-shaped swivel member in a snap-fitting manner.

9. The computer peripheral telecommunications device according to claim 1, wherein multiple use positions are defined.

10. The computer peripheral telecommunications device according to claim 1, wherein the cover portion is 360° rotatable on the housing.

11. The computer peripheral telecommunications device according to claim 10, wherein a range of use positions are defined by a semi-circle of 90° over 180° to 270°, with 0° being the protective position.

12. The computer peripheral telecommunications device according to claim 1, wherein the integrated antenna comprises a radiation pattern provided on a thin foil which is fixed to an inner surface of the cover portion.

13. The computer peripheral telecommunications device according to claim 1, wherein the integrated antenna comprises a sheet metal radiation pattern which is sandwiched between two layers of the cover portion.

14. The computer peripheral telecommunications device according to claim 1, wherein the electronic connection comprises a resilient contact.

15. The computer peripheral telecommunications device according to claim 1, wherein the electronic connection comprises a pogo pin.

16. The computer peripheral telecommunications device according to claim 1, wherein the electronic connection comprises a capacitive coupling.

17. The computer peripheral telecommunications device according to claim 1, wherein the device further comprises at least one slot for receiving an electronic card.

18. The computer peripheral telecommunications device according to claim 1, wherein the device further comprises a connector for connecting additional equipment.

19. The computer peripheral telecommunications device according to claim 1, wherein the device further comprises a movable or removable covering lip for covering a slot or a connector on the housing.

20. The computer peripheral telecommunications device according to claim 1, wherein the device further comprises a diversity antenna adjacent to the first side.

21. The computer peripheral telecommunications device according to claim 1, wherein the interface is a USB plug.

22. The computer peripheral telecommunications device according to claim 21, wherein the USB plug is eccentrically mounted on the housing to avoid that the device in use covers two adjacent USB sockets on a computer.

* * * * *